US008357618B2

(12) United States Patent
Bencher et al.

(10) Patent No.: US 8,357,618 B2
(45) Date of Patent: Jan. 22, 2013

(54) FREQUENCY DOUBLING USING A PHOTO-RESIST TEMPLATE MASK

(75) Inventors: Christopher Dennis Bencher, San Jose, CA (US); Huixiong Dai, San Jose, CA (US); Li Yan Miao, San Francisco, CA (US); Hao Chen, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 10 days.

(21) Appl. No.: 12/257,953

(22) Filed: Oct. 24, 2008

(65) Prior Publication Data
US 2009/0111281 A1  Apr. 30, 2009

Related U.S. Application Data

(60) Provisional application No. 60/983,058, filed on Oct. 26, 2007.

(51) Int. Cl.
*H01L 21/31* (2006.01)

(52) U.S. Cl. ........ 438/763; 438/689; 438/703; 257/313; 257/E21.24

(58) Field of Classification Search .................. 438/763, 438/689, 703; 257/E21.24, 313, 314; 430/E21.249
See application file for complete search history.

(56) References Cited

U.S. PATENT DOCUMENTS

| 5,328,810 | A | * | 7/1994 | Lowrey et al. ................. 430/313 |
| 6,063,688 | A | * | 5/2000 | Doyle et al. ................... 438/424 |
| 7,592,262 | B2 | * | 9/2009 | Huang et al. .................. 438/717 |
| 7,718,081 | B2 | * | 5/2010 | Liu et al. .......................... 216/41 |
| 2003/0224617 | A1 | * | 12/2003 | Baek et al. ..................... 438/763 |
| 2006/0093925 | A1 | * | 5/2006 | Cheng ................................ 430/5 |
| 2006/0194453 | A1 | * | 8/2006 | Murakami et al. ............ 438/787 |
| 2006/0273456 | A1 | * | 12/2006 | Sant et al. ...................... 257/734 |
| 2008/0122125 | A1 | * | 5/2008 | Zhou ............................. 257/797 |

FOREIGN PATENT DOCUMENTS

| JP | 9-82696 | * | 3/1997 |
| KR | 1020050072877 | | 7/2005 |
| WO | WO 2007/117718 | | 10/2007 |

OTHER PUBLICATIONS

Chis Bencher "SADP: The Best Option for ≦32nm NAND Flash" Oct. 25, 2007, Nanochip Technology Journal, Issue Two 2007, pp. 8-13.*
First Office Action in Chinese Patent Application No. 200810175121.4, mailed May 19, 2011, 9 pgs.
Final Office Action in Korean Patent Application No. 10-2008-0105268, dated Sep. 20, 2011, 3 pgs.

* cited by examiner

*Primary Examiner* — Hsien Ming Lee
*Assistant Examiner* — Walter H Swanson
(74) *Attorney, Agent, or Firm* — Blakely Sokoloff Taylor & Zafman LLP

(57) ABSTRACT

A method for doubling the frequency of a lithographic process using a photo-resist template mask is described. A device layer having a photo-resist layer formed thereon is first provided. The photo-resist layer is patterned to form a photo-resist template mask. A spacer-forming material layer is deposited over the photo-resist template mask. The spacer-forming material layer is etched to form a spacer mask and to expose the photo-resist template mask. The photo-resist template mask is then removed and an image of the spacer mask is finally transferred to the device layer.

20 Claims, 7 Drawing Sheets

FREQUENCY DOUBLING USING A PHOTO-RESIST TEMPLATE MASK

CROSS-REFERENCE TO RELATED APPLICATIONS

This application claims the benefit of U.S. Provisional Application No. 60/983,058 filed Oct. 26, 2007, the entire contents of which are hereby incorporated by reference herein.

BACKGROUND OF THE INVENTION

1) Field of the Invention

The invention is in the field of Semiconductor Processing.

2) Description of Related Art

For the past several decades, the scaling of features in integrated circuits has been the driving force behind an ever-growing semiconductor industry. Scaling to smaller and smaller features enables increased densities of functional units on the limited real estate of semiconductor chips. For example, shrinking transistor size allows for the incorporation of an increased number of logic and memory devices on a microprocessor, lending to the fabrication of products with increased complexity.

Scaling has not been without consequence, however. As the dimensions of the fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features. FIGS. 1A-C illustrate cross-sectional views representing a conventional semiconductor lithographic process, in accordance with the prior art.

Referring to FIG. 1A, a photo-resist layer 104 is provided above a semiconductor stack 102. A mask or reticle 106 is positioned above photo-resist layer 104. A lithographic process includes exposure of photo-resist layer 104 to light (hv) having a particular wavelength, as indicated by the arrows in FIG. 1A. Referring to FIG. 1B, photo-resist layer 104 is subsequently developed to provide patterned photo-resist layer 108 above semiconductor stack 102. That is, the portions of photo-resist layer 104 that were exposed to light are now removed. The width of each feature of patterned photo-resist layer 108 is depicted by the width 'x.' The spacing between each feature is depicted by the spacing 'y.' Typically, the limit for a particular lithographic process is to provide features having a critical dimension equal to the spacing between the features, i.e. x=y, as depicted in FIG. 1B.

Referring to FIG. 1C, the critical dimension (i.e. the width 'x') of a feature may be reduced to form patterned photo-resist layer 110 above semiconductor stack 102. The critical dimension may be shrunk by over-exposing photo-resist layer 104 during the lithographic step depicted in FIG. 1A or by subsequently trimming patterned photo-resist layer 108 from FIG. 1B. However, this reduction in critical dimension comes at the expense of an increased spacing between features, as depicted by spacing 'y' in FIG. 1C. That is, there may be a trade-off between the smallest achievable dimension of each of the features from patterned photo-resist layer 110 and the spacing between each feature.

Thus, a method to double the frequency of a semiconductor lithographic process is described herein.

DETAILED DESCRIPTION

Figure 1A:
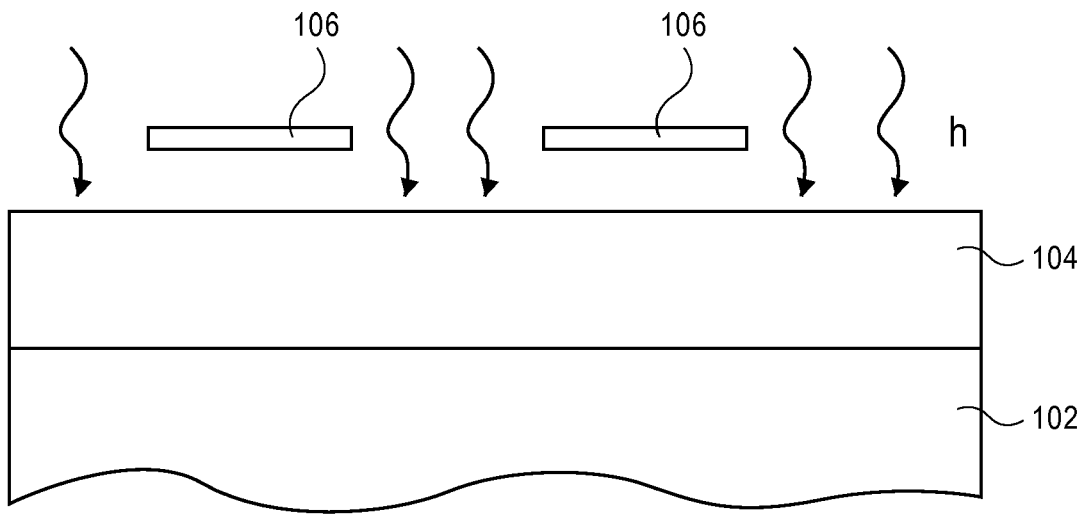
FIGS. 1A-C illustrate cross-sectional views representing a conventional semiconductor lithographic process, in accordance with the prior art.
Figure 1B:
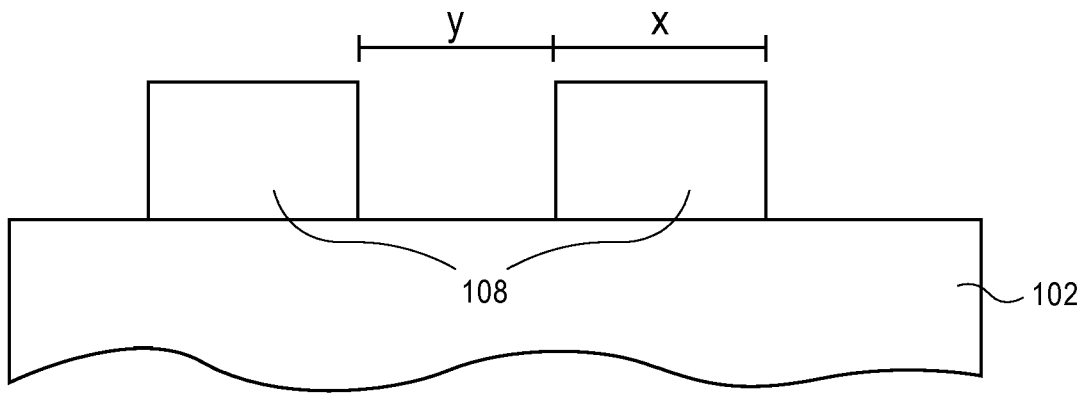
Figure 1C:
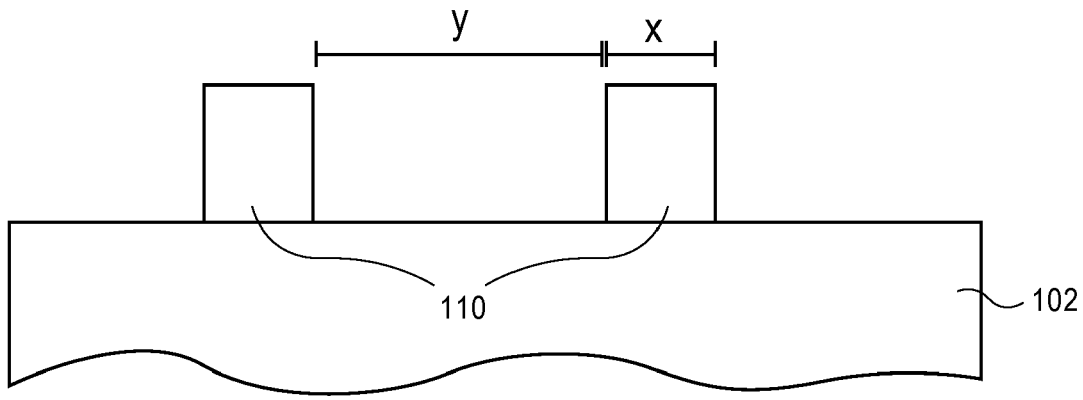

A method to double the frequency of a semiconductor lithographic process is described. In the following description, numerous specific details are set forth, such as fabrication conditions and material regimes, in order to provide a thorough understanding of the present invention. It will be apparent to one skilled in the art that the present invention may be practiced without these specific details. In other instances, well-known features, such as integrated circuit design layouts or photo-resist development processes, are not described in detail in order to not unnecessarily obscure the present invention. Furthermore, it is to be understood that the various embodiments shown in the Figures are illustrative representations and are not necessarily drawn to scale.

Disclosed herein is a method for doubling the frequency of a lithographic process using a photo-resist template mask. A layered structure may be provided, wherein the layered structure has a photo-resist layer formed thereon. In an embodiment, the photo-resist layer is patterned to form a photo-resist template mask and to expose a portion of the layered structure. A spacer-forming material layer may then be deposited over the photo-resist template mask and above the exposed portion of the layered structure. In one embodiment, the spacer-forming material layer is then etched to form a spacer mask and to expose the photo-resist template mask. The photo-resist template mask may next be removed. In a specific embodiment, an image of the spacer mask is finally transferred to the layered structure.

The use of a photo-resist template mask in a frequency doubling scheme may minimize the number of process steps required in such an integration scheme. For example, in accordance with an embodiment of the present invention, a photo-resist template mask is used as the foundation for formation of a spacer mask. Thus, instead of first patterning a photo-resist layer and then transferring the image of the patterned photo-resist layer to a mask layer in order to form a template mask, the patterned photo-resist layer itself may be used directly as a template mask. In one embodiment, the frequency of the features in a pattern of the photo-resist template mask are doubled by subsequently fabricating a spacer mask. For example, in accordance with an embodiment of the present invention, a spacer mask is fabricated having spacer lines formed adjacent to the sidewalls of a photo-resist template mask. That is, for every line in the photo-resist template mask, two spacer lines of the spacer mask are generated. A spacer mask providing substantially the same critical dimension (i.e. the same feature width) for each line, but having double the density of lines in a particular region, may thus be fabricated upon removal of the photo-resist template mask. For example, in one embodiment, the pitch of the photo-resist template mask is selected to be 4 in order to ultimately provide a spacer mask having a pitch of 2.

Although direct use of a photo-resist template mask may eliminate the need to fabricate a template mask in a layer distinct from the photo-resist layer, care may need to be taken when subjecting the photo-resist template mask to various process conditions. For example, in accordance with an embodiment of the present invention, a photo-resist template mask is sensitive to, i.e. becomes degraded when exposed to, high temperature process steps. Thus, when depositing a spacer-forming material layer (the material ultimately used to form the spacer mask) on the photo-resist template mask, it may be desirable to use a low-temperature deposition technique. In one embodiment, a low-temperature condensation process is used to deposit a spacer-forming material layer on a photo-resist template mask. In accordance with another embodiment of the present invention, a photo-resist template mask is formed directly on an amorphous carbon hard-mask layer. Because the photo-resist template mask may have similar etch characteristics as the etch characteristics of the amorphous carbon hard-mask layer, it may be impractical to remove the photo-resist template mask by an etch process. In one embodiment, however, the thermal properties of a photo-resist template mask are substantially different from the thermal properties of an amorphous carbon hard-mask layer. This difference in thermal properties may be exploited to selectively remove a photo-resist template mask from an amorphous carbon hard-mask layer. In a specific embodiment, a photo-resist template mask is removed with high selectivity to an amorphous carbon hard-mask layer by way of a sublimation process.

Figure 2:
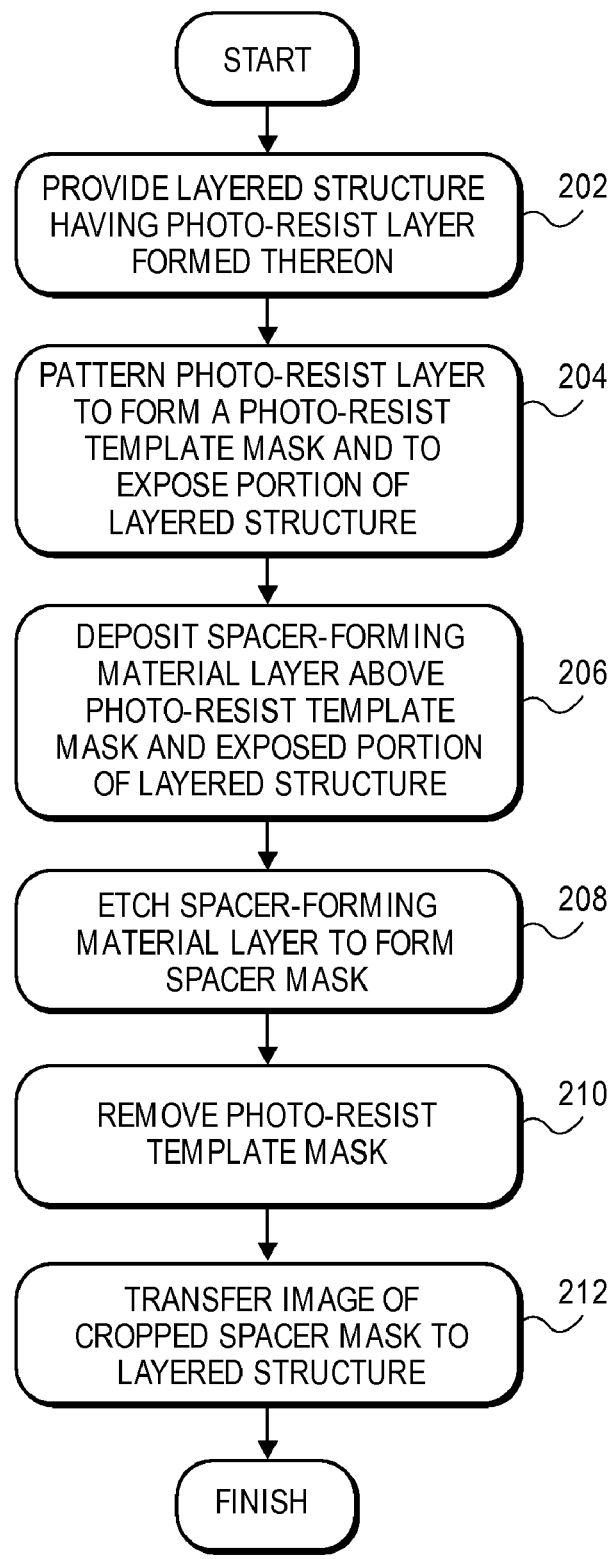
FIG. 2 is a Flowchart 200 representing a series of operations in a frequency doubling fabrication process, in accordance with an embodiment of the present invention.

The frequency of a semiconductor lithographic process may be doubled using a photo-resist template mask. FIG. 2 is a Flowchart 200 representing a series of operations in a frequency doubling fabrication process, in accordance with an embodiment of the present invention. FIGS. 3A-G illustrate cross-sectional views representing the series of operations from Flowchart 200 of FIG. 2 as applied to a layered structure, in accordance with an embodiment of the present invention.

Figure 3A:
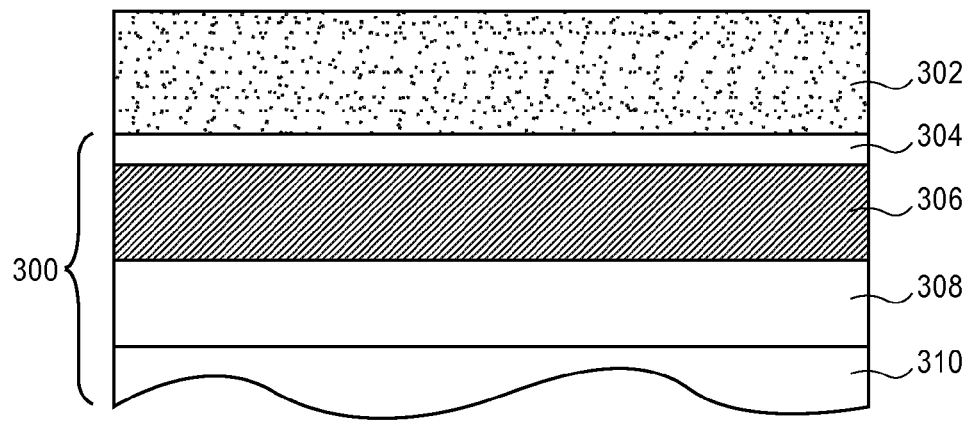
FIGS. 3A-G illustrate cross-sectional views representing the series of operations from Flowchart 200 of FIG. 2 as applied to a layered structure, in accordance with an embodiment of the present invention.

Referring to operation 202 of Flowchart 200 and corresponding FIG. 3A, a structure 300 is provided having a photo-resist layer 302 formed thereon. In accordance with an embodiment of the present invention, at least a portion of structure 300 will ultimately be patterned by using a process that incorporates a photo-resist template mask. In one embodiment, structure 300 is a layered structure, as depicted in FIG. 3A. A device layer may be patterned by forming a photo-resist template mask directly thereon. Alternatively, a hard-mask structure which resides above a device layer may first be patterned and the pattern subsequently transferred from the hard-mask structure to the device layer. Thus, in a specific embodiment, structure 300 includes a first hard-mask layer 304, a second hard-mask layer 306 and a device layer 308, as depicted in FIG. 3A. In a particular embodiment, first hard-mask layer 304 and second hard-mask layer 306 are removed following a patterning process, while device layer 308 is patterned and ultimately retained.

Photo-resist layer 302 may be composed of any material suitable for use in a lithographic process. That is, photo-resist layer 302 will ultimately be exposed to a light source and subsequently developed. In an embodiment, the portions of photo-resist layer 302 to be exposed to the light source will be removed upon developing photo-resist layer 302, i.e. photo-resist layer 302 is composed of a positive photo-resist material. In a specific embodiment, photo-resist layer 302 is composed of a positive photo-resist material selected from the group consisting of a 248 nm resist, a 193 nm resist, a 157 nm resist, an extreme ultra-violet (EUV) resist and a phenolic resin matrix with a diazonaphthoquinone sensitizer. In another embodiment, the portions of photo-resist layer 302 to be exposed to the light source will be retained upon developing photo-resist layer 302, i.e. photo-resist layer 302 is composed of a negative photo-resist material. In a specific embodiment, photo-resist layer 302 is composed of a negative photo-resist material selected from the group consisting of poly-cis-isoprene and poly-vinyl-cinnamate. The thickness of photo-resist layer 302 may be sufficiently thin to prevent spacer mask line-collapse of a subsequently formed spacer mask formed thereon and sufficiently thick to enable critical dimension control of the spacer mask lines. In one embodiment, the thickness of photo-resist layer 302 is in the range of 4.06-5.625 times the targeted line width of a subsequently formed spacer mask.

First hard-mask layer 304 may be composed of any material suitable to withstand an etch process used to form a spacer mask based on a photo-resist template mask, i.e. suitable to protect second hard-mask layer 306 during formation of a spacer mask based on a photo-resist template mask. In accordance with an embodiment of the present invention, a subsequently formed spacer mask is composed of silicon oxide and first hard-mask layer 304 is composed of a material selected from the group consisting of silicon nitride, amorphous silicon and poly-crystalline silicon. The thickness of first hard-mask layer 304 may be sufficiently thick to avoid pinholes that may undesirably expose second hard-mask layer 306 to an etch process used to form a spacer mask. In one embodiment, the thickness of first hard-mask layer 304 is in the range of 15-40 nanometers.

Second hard-mask layer 306 may be composed of any material suitable to form a patterning mask based on the transferred image of a spacer mask. In accordance with an embodiment of the present invention, second hard-mask layer 306 has similar etch characteristics as the etch characteristics of photo-resist layer 302. Thus, in one embodiment, second hard-mask layer 306 is protected by first hard-mask layer 304 during a photo-resist layer 302 trimming or removal process, as described in association with FIGS. 3B and 3E below. For example, in a specific embodiment, photo-resist layer 302 and second hard-mask layer 306 are composed substantially of carbon atoms. In one embodiment, second hard-mask layer 306 consists essentially of a mixture of $sp^3$ (diamond-like)-, $sp^2$ (graphitic)- and $sp^1$ (pyrolitic)-hybridized carbon atoms formed from a chemical vapor deposition process using hydrocarbon precursor molecules. Such a film may be known in the art as an amorphous carbon film, an example of which is the Advanced Patterning Film™ (APF™) from Applied Materials. In accordance with an embodiment of the present invention, second hard-mask layer 306 is an amorphous carbon film and has different thermal characteristics from the thermal characteristics of photo-resist layer 302. In one embodiment, this difference in thermal characteristics is exploited to selectively remove photo-resist layer 302 from second hard-mask layer 306 composed of an amorphous carbon film. The thickness of second hard-mask layer 306 may be any thickness suitable to provide a practical aspect ratio for use in a subsequently formed patterning mask. In a particular embodiment, the thickness of second hard-mask layer 306 is in the range of 3.125-6.875 times the targeted width of each of the lines of a subsequently formed patterning mask.

Device layer 308 may be any layer desirable for device fabrication or any other structure fabrication requiring a double frequency mask (e.g. semiconductor structures, MEMS structures and metal line structures). For example, in accordance with an embodiment of the present invention, device layer 308 may be composed of any material having any thickness that can be suitably patterned into an array of distinctly defined semiconductor structures. In one embodiment, device layer 308 is composed of a group IV-based material or a III-V material. Additionally, device layer 308 may comprise any morphology that can suitably be patterned into an array of distinctly defined semiconductor structures. In an embodiment, the morphology of device layer 308 is selected from the group consisting of amorphous, mono-crystalline and poly-crystalline. In one embodiment, device layer 308 comprises charge-carrier dopant impurity atoms. In a specific embodiment, device layer 308 has a thickness in the range of 50-1000 nanometers. Device layer 308 may be composed of a metal. In one embodiment, device layer 308 is composed of a metal species which may include, but is not limited to, metal nitrides, metal carbides, metal silicides, hafnium, zirconium, titanium, tantalum, aluminum, ruthenium, palladium, platinum, cobalt, copper and nickel. Device layer 308 may further reside above a substrate 310. Substrate 310 may be composed of any material suitable to withstand a fabrication process. In an embodiment, substrate 310 is composed of a flexible plastic sheet. Substrate 310 may further be composed of a material suitable to withstand a manufacturing process and upon which semiconductor layers may suitably reside. In an embodiment, substrate 310 is composed of group IV-based materials such as crystalline silicon, germanium or silicon/germanium. In another embodiment, substrate 310 is composed of a III-V material. Substrate 310 may also comprise an insulating layer. In one embodiment, the insulating layer is composed of a material selected from the group consisting of silicon oxide, silicon nitride, silicon oxy-nitride and a high-k dielectric layer.

Figure 3B:
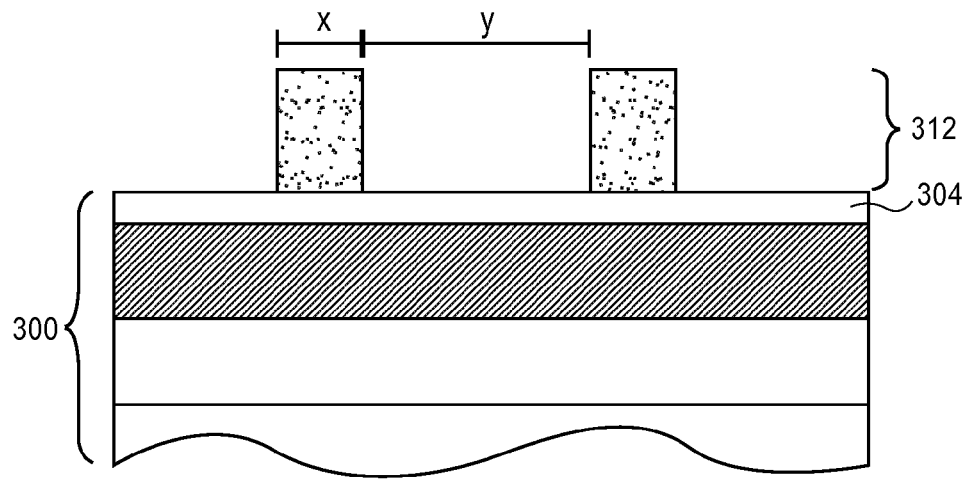

Referring to operation 204 of Flowchart 200 and corresponding FIG. 3B, photo-resist layer 302 is patterned to form a photo-resist template mask 312. A portion of structure 300 and, in particular, a portion of the top surface of first hard-mask layer 304 is exposed upon patterning photo-resist layer 302, as depicted in FIG. 3B.

Photo-resist layer 302 may be patterned to form photo-resist template mask 312 by any method suitable to provide well-defined features for photo-resist template mask 312 while exposing desired portions of first hard-mask layer 302. In accordance with an embodiment of the present invention, photo-resist layer 302 is patterned to form photo-resist template mask 312 by a lithographic/development process selected from the group consisting of 248 nm lithography/development, 193 nm lithography/development, 157 nm lithography/development, extreme ultra-violet (EUV) lithography/development and direct-write lithography/development.

Photo-resist template mask 312 may have any dimensions suitable for use in a spacer mask fabrication process. In accordance with an embodiment of the present invention, the width 'x' of each feature of photo-resist template mask 312 is selected to substantially correlate with the desired critical dimension of a subsequently formed semiconductor device feature. For example, in one embodiment, the width 'x' of each feature of photo-resist template mask 312 is selected to substantially correlate with the desired critical dimension of a gate electrode. In one embodiment, the width 'x' is in the range of 10-100 nanometers. The spacing between lines 'y' may be selected to optimize a frequency doubling scheme. That is, in accordance with an embodiment of the present invention, a subsequently fabricated spacer mask is targeted such that the width of the spacer lines of the spacer mask are substantially the same as the width 'x' of each feature of photo-resist template mask 312. Furthermore, the spacing between subsequently formed spacer lines is targeted to be substantially equal to the width of each spacer region. Thus, in one embodiment, because the frequency will ultimately be doubled, the spacing 'y' between each feature in photo-resist template mask 312 is approximately equal to 3 times the value 'x,' as depicted in FIG. 3B. That is, the pitch of photo-resist template mask 312 is selected to be approximately 4 in order to ultimately provide a spacer mask with spacer lines having a pitch of approximately 2.

The approximate 3:1 spacing:width ratio for the features of photo-resist template mask 312 may be achieved by over-exposing a positive photo-resist layer at the exposure step of a lithography process or by trimming photo-resist layer 302 subsequent to a lithographic/development process. In one embodiment, photo-resist template mask 312 is composed of 193 nm positive photo-resist that was trimmed post development by using a plasma etch chemistry based on $O_2$ gas. Because the trimming process may also otherwise impact second hard-mask layer 306, in accordance with an embodiment of the present invention, first hard-mask layer 304 is present to protect second hard-mask layer 306 during such a trimming process.

Figure 3C:
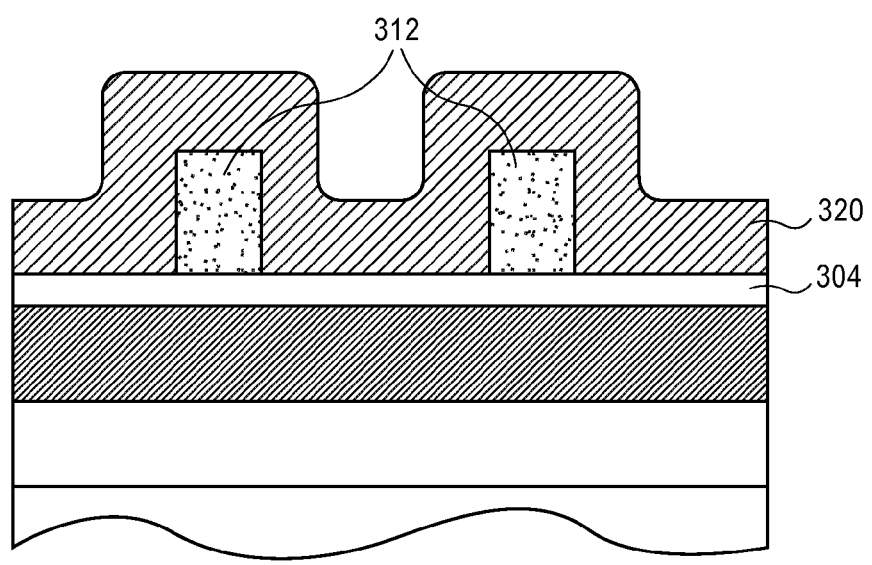

Referring to operation 206 of Flowchart 200 and corresponding FIG. 3C, a spacer-forming material layer 320 is deposited above and conformal with photo-resist template mask 312 and the exposed portion of first hard-mask layer 304. Spacer-forming material layer 320 is the source of material for what will ultimately become a spacer mask for use in a frequency doubling scheme based on a photo-resist template mask.

Spacer-forming material layer 320 may be composed of any material compatible with photo-resist template mask 312 and suitable to form a reliable mask for use in a subsequent etch process. Although direct use of photo-resist template mask 312 may eliminate the need to fabricate a template mask in a layer distinct from the photo-resist layer, in accordance with an embodiment of the present invention, care needs to be taken when subjecting photo-resist template mask 312 to various process conditions. For example, in one embodiment, photo-resist template mask 312 becomes degraded when subjected to the high temperatures (for example, temperatures above 120 degrees Celsius used in conventional chemical vapor deposition techniques) typically used to deposit spacer-forming material layers. Thus, when depositing spacer-forming material layer 320, it may be desirable to use a low-temperature deposition technique. For example, in an embodiment, spacer-forming material layer 320 is deposited at a temperature less than the glass-transition temperature of photo-resist template mask 312. In accordance with an embodiment of the present invention, a low-temperature condensation process is used to deposit spacer-forming material layer 320 on photo-resist template mask 312. The condensation process may be any process wherein the deposition of a material layer from gaseous precursors is driven by accumulation of the resulting material layer on a surface that is cool relative to the temperature of the gaseous precursors. For example, in one embodiment, photo-resist template mask 312 and structure 300 are maintained at a temperature in the range of 0-100 degrees Celsius throughout the condensing of spacer-forming material layer 320 on photo-resist template mask 312. In a specific embodiment, the condensation process is carried out at a temperature in the range of 0-100 degrees for a duration of less than approximately 60 seconds. In one embodiment, photo-resist template mask 312 and structure 300 are maintained at a temperature less than approximately 80 degrees Celsius throughout the condensing of spacer-forming material layer 320 on photo-resist template mask 312. In a specific embodiment, the condensation process is carried out at a temperature less than approximately 80 degrees Celsius for a duration of less than approximately 90 seconds. In a particular embodiment, spacer-forming material layer 320 is composed of silicon oxide formed by a condensation process. In another particular embodiment, spacer-forming material layer 320 is composed of carbon-doped silicon oxide having an atomic concentration of carbon atoms in the range of 5-15% and formed by a condensation process. In an embodiment, spacer-forming material layer 320 is composed of carbon-doped silicon oxide having an atomic concentration of carbon atoms of 7%. In another embodiment, the use of a high concentration of $O_3$ provides a highly conformal condensation deposition of spacer-forming material layer 320.

The thickness of spacer-forming material layer 320 may be selected to determine the width of the features in a subsequently formed spacer mask. Thus, in accordance with an embodiment of the present invention, the thickness of spacer-forming material layer 320 is substantially the same as the width of the features of photo-resist template mask 312, as depicted in FIG. 3C. Although for a frequency doubling scheme the ideal thickness of spacer-forming material layer 320 is the same as the width of the features of photo-resist template mask 312, the initial targeted width may be required to be slightly thicker to compensate for an etch process used to subsequently pattern spacer-forming material layer 320. In one embodiment, the thickness of spacer-forming material layer 320 is approximately 1.06 times the width of the features of photo-resist template mask 312, i.e. 1.06 times the desired feature width of the lines in a subsequently formed spacer mask.

Figure 3D:
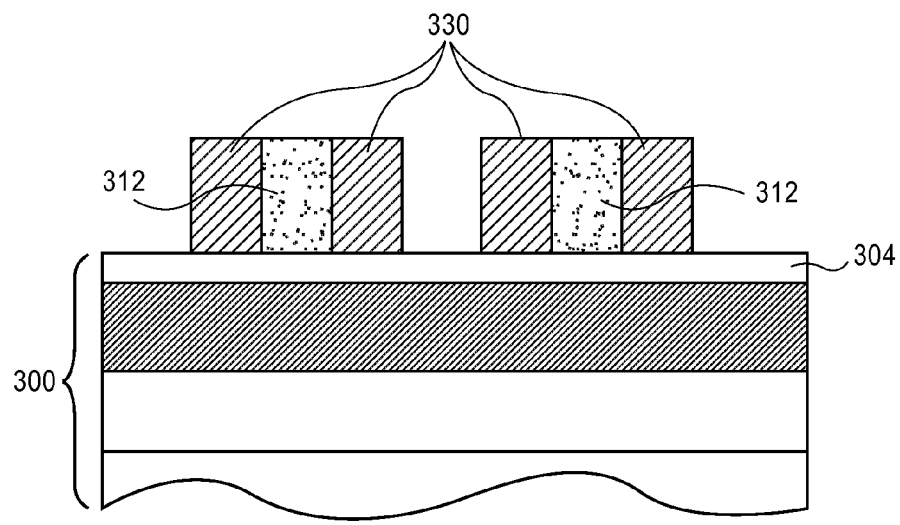

Referring to operation 208 of Flowchart 200 and corresponding FIG. 3D, spacer-forming material layer 320 is etched to provide spacer mask 330. The lines of spacer mask 330 are conformal with the sidewalls of the features of photo-resist template mask 312. Thus, there are two lines for spacer mask 330 for every line of photo-resist template mask 312. A portion of structure 300 and, in particular, a portion of the top surface of first hard-mask layer 304 is re-exposed upon etching spacer-forming material layer 320, as depicted in FIG. 3D.

Spacer-forming material layer 320 may be etched to provide spacer mask 330 by any process suitable to provide well-controlled dimensions. For example, in one embodiment, spacer-forming material layer 320 is etched to form spacer mask 330 by a process that provides a spacer width approximately equal to the critical dimension of photo-resist template mask 312. In accordance with an embodiment of the present invention, spacer-forming material layer 320 is etched until the features of photo-resist template mask 312 are exposed, i.e. until all portions covering the top surface of photo-resist template mask 312 are removed. In one embodiment, spacer-forming material layer 320 is etched until the lines of spacer mask 330 are substantially the same height as the features of photo-resist template mask 312, as depicted in FIG. 3D. However, in another embodiment, the lines of spacer mask 330 are recessed slightly below the top surface of the features of photo-resist template mask 312 in order to ensure that the continuity of spacer-forming material layer 320 is broken above and between the lines of spacer mask 330. Spacer-forming material layer 320 may be etched such that the spacer lines of spacer mask 330 retain a substantial portion of the original thickness of spacer-forming material layer 320. In a particular embodiment, the width of the top surface of each line of spacer mask 330 is substantially the same as the width at the interface of spacer mask 330 and first hard-mask layer 304, as depicted in FIG. 3D.

The etching of spacer-forming material layer 320 to provide spacer mask 330 may be carried out to form spacer mask 330 with high etch selectivity to first hard-mask layer 304 in order to protect second hard-mask layer 306. In a particular embodiment, first hard-mask layer 304 is composed of a material selected from the group consisting of silicon nitride, amorphous silicon and poly-crystalline silicon, spacer-forming material layer 320 is composed of silicon oxide or carbon-doped silicon oxide, and spacer-forming material layer 320 is etched to form spacer mask 330 using a dry etch process with a gas selected from the group consisting of $C_4F_8$, $CH_2F_2$ and $CHF_3$.

Figure 3E:
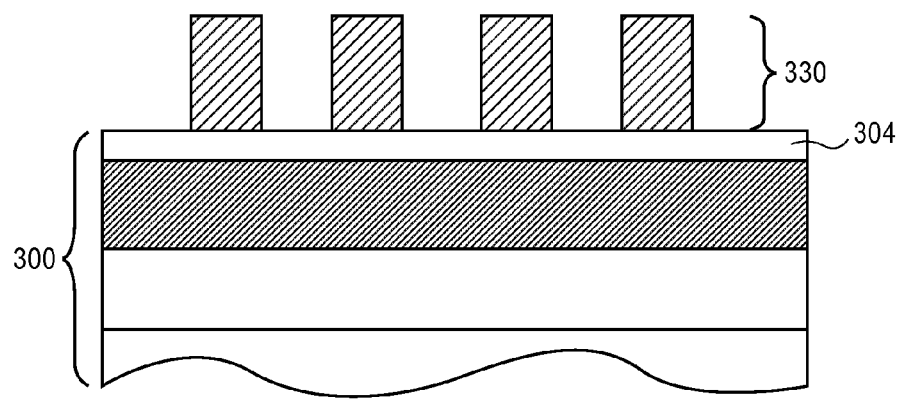

Referring to operation 210 of Flowchart 200 and corresponding FIG. 3E, photo-resist template mask 312 is removed to leave only spacer mask 330 above structure 300. In accordance with an embodiment of the present invention, spacer mask 330 is used directly to pattern a device layer. In another embodiment, spacer mask 330 cannot withstand an etch process used to pattern a device layer and, accordingly, the image of spacer mask 330 is first transferred into a hard-mask layer and then into a device layer. In one embodiment, the hard-mask layer is a dual hard-mask layer. In a specific embodiment, the portion of structure 300 and, in particular, the portion of the top surface of first hard-mask layer 304 that was previously masked by photo-resist template mask 312 is now exposed, as depicted in FIG. 3E.

Photo-resist template mask 312 may be removed by any process suitable to entirely expose the portions of first hard-mask layer 304 previously covered by photo-resist template mask 312. In accordance with an embodiment of the present invention, photo-resist template mask 312 is removed by way of a sublimation process. A sublimation process may be a physical transformation, as opposed to a chemical transformation such as an etch process. A sublimation process used to remove photo-resist template mask 312 may be any process that ultimately converts photo-resist template mask 312 to the gas-phase. Thus, although the term sublimation is conventionally used to describe the direct conversion from solid to gas phase, herein, any process which ultimately leads to a gas-phase removal of photo-resist template mask 312 may be characterized as a sublimation process. Thus, in accordance with an embodiment of the present invention, photo-resist template mask 312 is heated until gaseous, but upon heating the material exhibits an intermediate phase selected from the group consisting of liquid-phase and glass-phase prior to becoming gaseous. In a specific embodiment, photo-resist template mask 312 is removed by heating to a temperature of approximately 550 degrees Celsius. In another specific embodiment, photo-resist template mask 312 is removed by heating to a temperature sufficiently low and for a duration sufficiently short as to not significantly modify the properties and dimensions of spacer mask 330 previously formed by a condensation process. Additionally, photo-resist template mask 312 may be comprised of a polymer and may not classically be defined as a solid material. Nonetheless, the term sublimation is used herein to also describe conversion of photo-resist template mask 312 comprised of a polymer to the gas-phase.

In accordance with an alternative embodiment of the present invention, photo-resist template mask 312 is removed with a process that would otherwise also etch second hard-mask layer 306, but is blocked by first hard-mask 304. In one embodiment, photo-resist template mask 312 is removed by an etch or an ash process using a plasma based on $O_2$ gas.

Figure 3F:
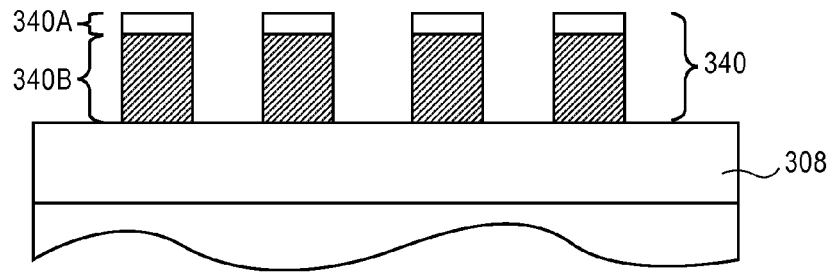

Referring to operation 212 of Flowchart 200 and corresponding FIG. 3F, the image of spacer mask 330 is transferred to first and second hard-mask layers 304 and 306, respectively, to form patterning mask 340 in structure 300. Patterning mask 340 is comprised of a first hard-mask portion 340A and a second hard-mask portion 340B.

The image of spacer mask 330 may be transferred to first and second hard-mask layers 304 and 306 by any process suitable to reliably maintain the pattern and dimensions of spacer mask 330 during the transfer process. In one embodiment, the image of spacer mask 330 is transferred to first and second hard-mask layers 304 and 306 in a single-step etch process. In accordance with another embodiment of the present invention, the image of spacer mask 330 is transferred into first hard-mask layer 304 and second hard-mask layer in two distinct etch steps, respectively. In one embodiment, first hard-mask layer 304 is composed substantially of amorphous or poly-crystalline silicon and is etched to form first hard-mask portion 340A with a dry etch using the gas $CHF_3$. In another embodiment, first hard-mask layer 304 is composed substantially of silicon nitride and is etched to form first hard-mask portion 340A with a dry etch using gases selected from the group consisting of $C_4F_8$, $Cl_2$ and HBr.

Figure 3G:
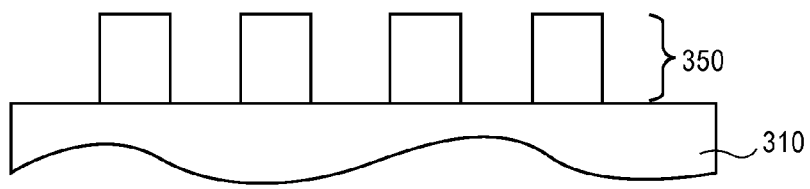

In accordance with an embodiment of the present invention, the image of spacer mask 330 is then transferred from first hard-mask portion 340A to second hard-mask layer 306 in a second etch step. Second hard-mask layer 306 and, hence, second hard-mask 340B of patterning mask 340 may be composed of any material suitable for substantially withstanding an etch process used to subsequently pattern device layer 308. In one embodiment, second hard-mask layer 306 consists essentially of amorphous carbon and is patterned with the image of spacer mask 330 by any process that maintains a substantially vertical profile for each of the lines of patterning mask 340, as depicted in FIG. 3F. In a particular embodiment, second hard-mask layer 306 is composed of amorphous carbon and is etched to form second hard-mask portion 340B of patterning mask 340 with a dry etch process using a plasma comprised of gases selected from the group consisting of the combination of $O_2$ and $N_2$ or the combination of $CH_4$, $N_2$ and $O_2$. Spacer mask 330 may also be removed, as depicted in FIG. 3F. In accordance with an embodiment of the present invention, spacer mask 330 is removed by an etch process similar to the etch process used to etch spacer-forming material layer 320 to provide spacer mask 330, as described in association with FIG. 3D. Thus, in one embodiment, spacer mask 330 is removed by an etch process using a gas selected from the group consisting of $C_4F_8$, $CH_2F_2$ and $CHF_3$. The image of patterning mask 340 may then be transferred to device layer 308 to provide patterned device layer 350, as depicted in FIG. 3G. In one embodiment, patterned device layer 350 is disposed above substrate 310.

Thus, a method to fabricate a patterning mask 340 comprised of lines that double the frequency of the lines from a photo-resist template mask has been described. Patterning mask 340 may then be used to pattern device layer 308 for, e.g. device fabrication for an integrated circuit. In accordance with an embodiment of the present invention, patterning mask 340 has a second hard-mask portion 340B consisting essentially of amorphous carbon. During an etch process used to pattern device layer 308, the amorphous carbon material becomes passivated and is thus able to retain its image and dimensionality throughout the entire etch of device layer 308. Therefore, although spacer mask 330 has the desired dimensions for patterning device layer 308, the material of spacer mask 330 may not be suitable to withstand a precise image transfer to device layer 308, i.e. it may degrade during the etch process. Hence, in accordance with an embodiment of the present invention, the image of spacer mask 330 is first transferred to a layer consisting essentially of amorphous carbon prior to transferring the image to device layer 308, as described in association with FIGS. 3E and 3F.

Figure 4:
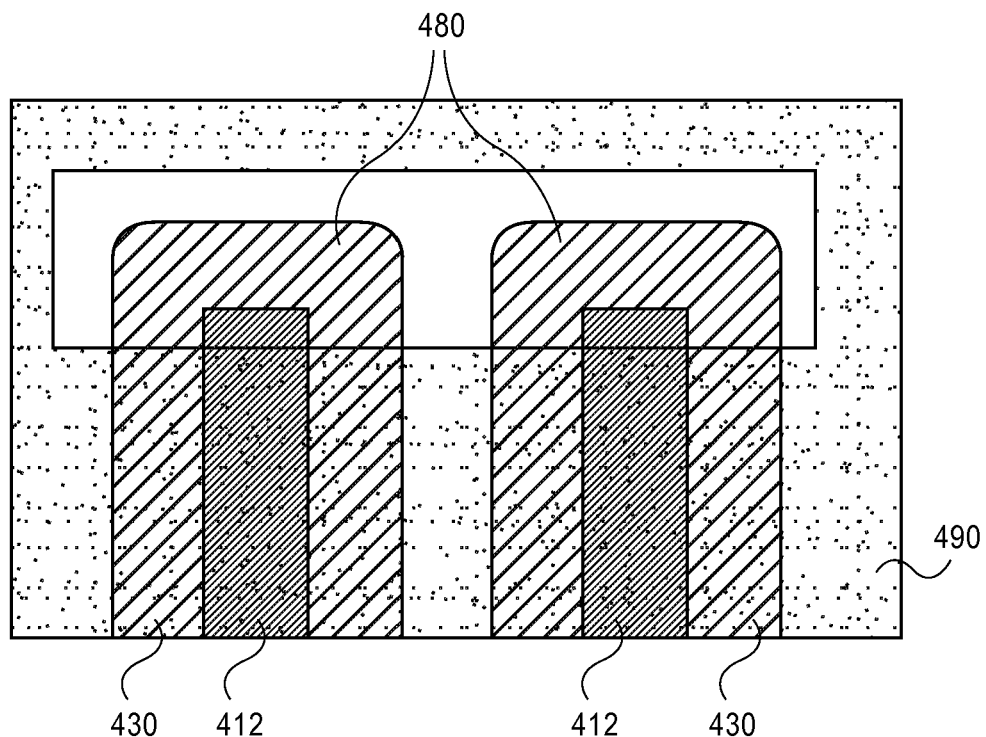
FIG. 4 illustrates a cross-sectional view representing a step in a spacer mask cropping process, in accordance with an embodiment of the present invention.

Prior to transferring the image of spacer mask 330 to first and second hard-mask layers 304 and 306, it may be desirable to first crop spacer mask 330 to form a cropped spacer mask. For example, in the etch step used to form spacer mask 330 described in association with FIG. 3D, spacer lines from spacer mask 330 were made discontinuous between neighboring lines of photo-resist template mask 312. However, spacer lines of spacer mask 330 associated with the same line from photo-resist template mask 312 remain continuous around the ends of each of the lines of photo-resist template mask 312. In accordance with another embodiment of the present invention, the continuity between pairs of spacer lines in spacer mask 330 is broken around the ends of the lines of photo-resist template mask 312 to enable more flexibility in design lay-outs for subsequent semiconductor device manufacture. FIG. 4 illustrates a cross-sectional view representing a step in a spacer mask cropping process, in accordance with an embodiment of the present invention. In an embodiment, a layer of photo-resist 490 is deposited and patterned above a spacer mask 430 and a photo-resist template mask 412. In one embodiment, the ends of spacer lines 480 from spacer mask 430 are etched to form a cropped spacer mask prior to the removal of photo-resist template mask 412. In an alternative embodiment, the ends of spacer lines 480 from spacer mask 430 are etched to form a cropped spacer mask subsequent to the removal of photo-resist template mask 412. In a particular embodiment, photo-resist layer 490 used in the cropping process is subsequently removed at the same time as the removal of photo-resist template mask 412.

Figure 5:
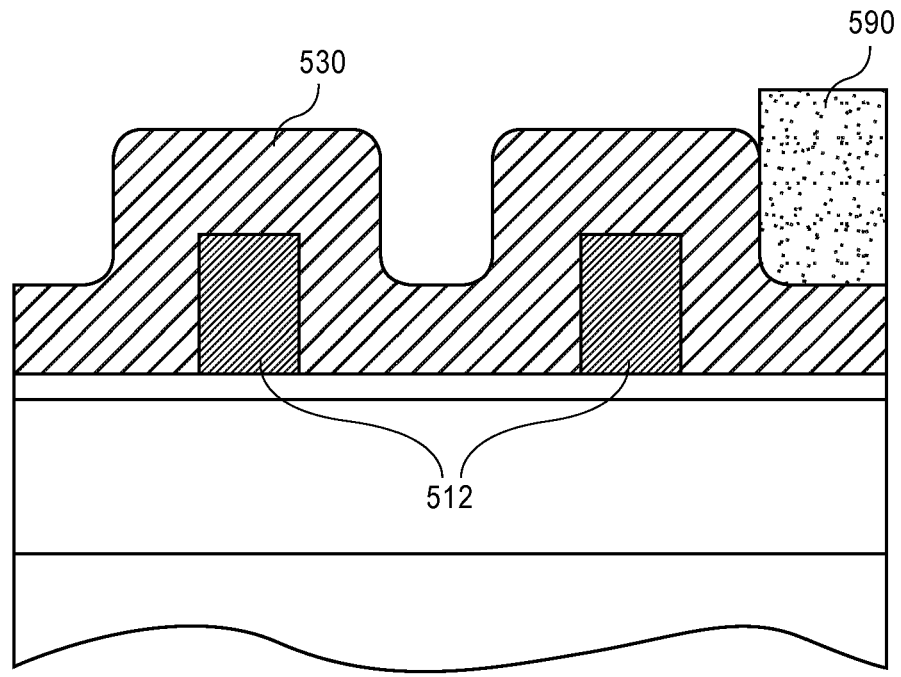
FIG. 5 illustrates a cross-sectional view representing a step in an area-preservation process, in accordance with an embodiment of the present invention.

In forming spacer mask 330, it may be desirable to retain more than just the portion of spacer-forming material layer 320 that is conformal with the sidewalls photo-resist template mask 312. Thus, in accordance with another embodiment of the present invention, area-preservation regions are retained during the formation of spacer mask 330. FIG. 5 illustrates a cross-sectional view representing a step in an area-preservation process, in accordance with an embodiment of the present invention. In an embodiment, a layer of photo-resist 590 is disposed above a spacer-forming material layer 530 prior to etching. A portion of spacer-forming material layer 530 that would otherwise be removed in the etch step used to form a spacer mask is retained in such an area-preservation process. Thus, a spacer mask may include an area-preservation portion. In a particular embodiment, photo-resist layer 590 used in the area-preservation process is removed at the same time as the removal of a photo-resist template mask 512.

The frequency of a semiconductor lithographic process may be doubled using a photo-resist template mask in the presence of an exposed amorphous carbon layer. FIG. 2 is a Flowchart 200 representing a series of operations in a frequency doubling fabrication process, in accordance with an embodiment of the present invention. FIGS. 6A-G illustrate cross-sectional views representing the series of operations from Flowchart 200 of FIG. 2 as applied to a layered structure, in accordance with an embodiment of the present invention.

Figure 6A:
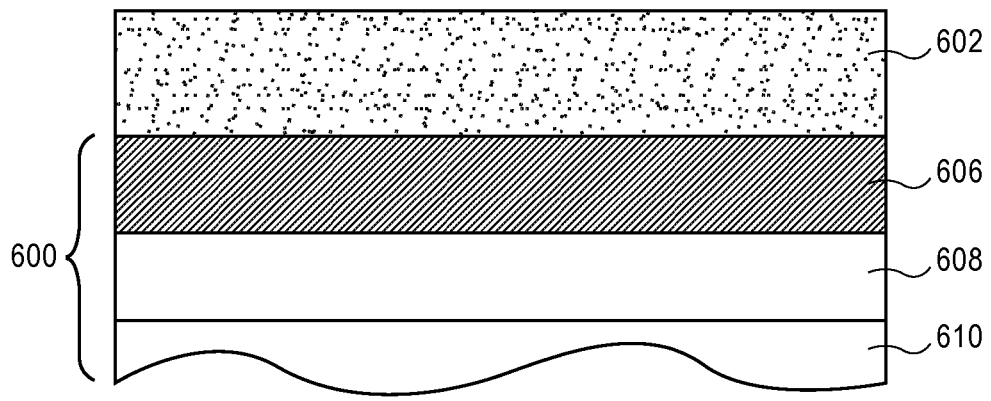
FIGS. 6A-G illustrate cross-sectional views representing the series of operations from Flowchart 200 of FIG. 2 as applied to a layered structure, in accordance with an embodiment of the present invention.

Referring to operation 202 of Flowchart 200 and corresponding FIG. 6A, a structure 600 is provided having a photo-resist layer 602 formed thereon. Structure 600 is comprised of an amorphous carbon hard-mask layer 606, a device layer 608 and a substrate 610. In accordance with an embodiment of the present invention, photo-resist layer 602 is formed directly on amorphous carbon hard-mask layer 606, as depicted in FIG. 6A. Photo-resist layer 602, device layer 608 and substrate 610 may be comprised of any material and have any dimensions described in association with photo-resist layer 302, device layer 308 and substrate 310, respectively, from FIG. 3A. Amorphous carbon hard-mask layer 606 may be composed of an amorphous carbon film and have any dimension as described in association with second hard-mask layer 306 from FIG. 3A.

Figure 6B:
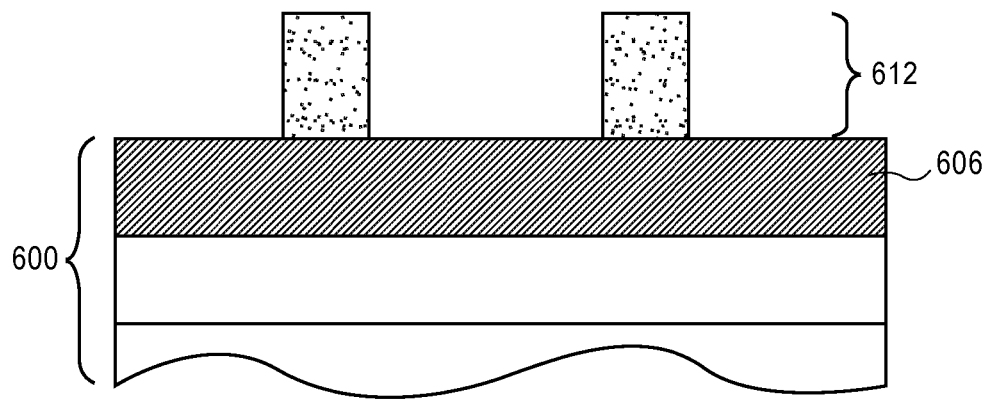

Referring to operation 204 of Flowchart 200 and corresponding FIG. 6B, photo-resist layer 602 is patterned to form a photo-resist template mask 612. A portion of structure 600 and, in particular, a portion of the top surface of amorphous carbon hard-mask layer 606 is exposed upon patterning photo-resist layer 602, as depicted in FIG. 6B. Photo-resist layer 602 may be patterned to form photo-resist template mask 612 by any technique and to any dimensions described in association with the patterning of photo-resist layer 302 from FIG. 3B. However, in accordance with an embodiment of the present invention, because the top surface of amorphous carbon hard-mask layer 606 is exposed upon patterning photo-resist layer 602 to form photo-resist template mask 612, any trimming process with an $O_2$-based plasma used to trim the dimensions of photo-resist layer 602 is of a duration sufficiently short as to not significantly impact amorphous carbon hard-mask layer 606.

Figure 6C:
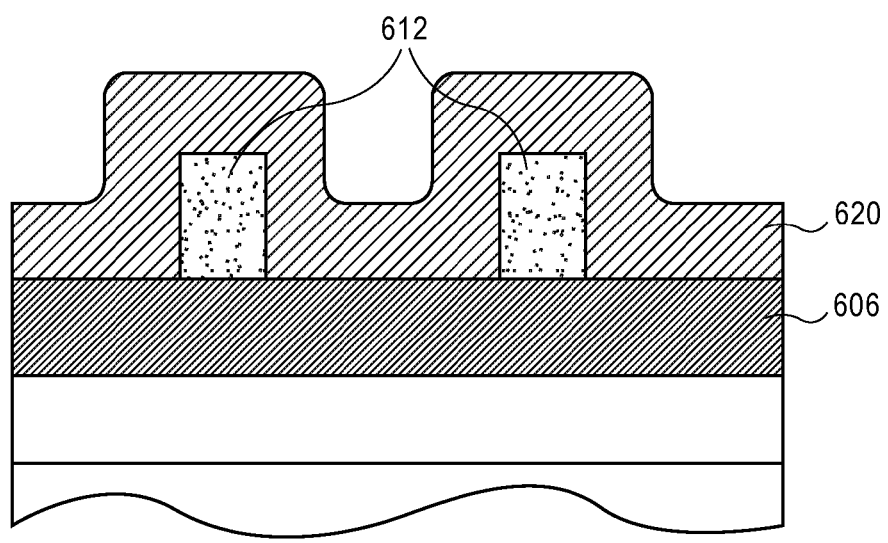

Referring to operation 206 of Flowchart 200 and corresponding FIG. 6C, a spacer-forming material layer 620 is deposited above and conformal with photo-resist template mask 612 and the exposed portion of amorphous carbon hard-mask layer 606. Spacer-forming material layer 620 is the source of material for what will ultimately become a spacer mask for use in a frequency doubling scheme based on a photo-resist template mask. Spacer-forming material layer 620 may be comprised of any material and have any dimensions described in association with spacer-forming material layer 320 from FIG. 3C. Thus, in accordance with an embodiment of the present invention, spacer-forming material layer 620 is composed of a material deposited by a low-temperature condensation process.

Figure 6D:
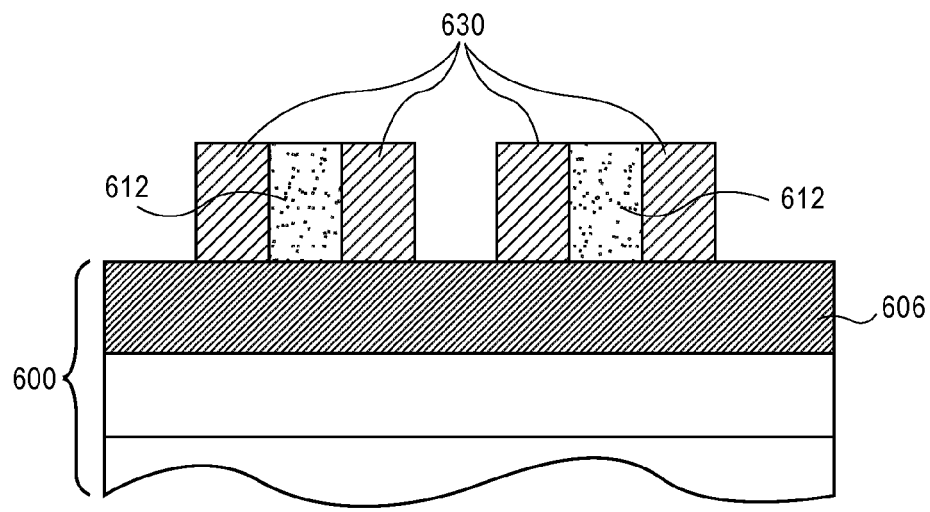

Referring to operation 208 of Flowchart 200 and corresponding FIG. 6D, spacer-forming material layer 620 is etched to provide spacer mask 630. The lines of spacer mask 630 are conformal with the sidewalls of the features of photo-resist template mask 612. Thus, there are two lines for spacer mask 630 for every line of photo-resist template mask 612. A portion of structure 600 and, in particular, a portion of the top surface of amorphous carbon hard-mask layer 606 is re-exposed upon etching spacer-forming material layer 620, as depicted in FIG. 6D. Spacer-forming material layer 620 may be etched to provide spacer mask 630 by any process described in association with the etching of spacer-forming material layer 320 to provide spacer mask 330 in FIG. 3D. However, in accordance with an embodiment of the present invention, spacer-forming material layer 620 is etched with substantial selectivity to amorphous carbon hard-mask layer 606. For example, in one embodiment, the thickness of the exposed portions of amorphous carbon hard-mask layer 606 removed during the etch of spacer-forming material layer 620 is in the range of 0-5% of the total thickness of amorphous carbon hard-mask layer 606. In a particular embodiment, spacer-forming material layer 620 is composed of silicon oxide or carbon-doped silicon oxide and is etched to form spacer mask 630 using a dry etch process with a gas selected from the group consisting of $C_4F_8$, $C_2F_2$ and $CHF_3$ for a duration sufficiently long to complete the etch of spacer-forming material layer 620 but sufficiently short to not substantially impact amorphous carbon hard-mask layer 606.

Figure 6E:
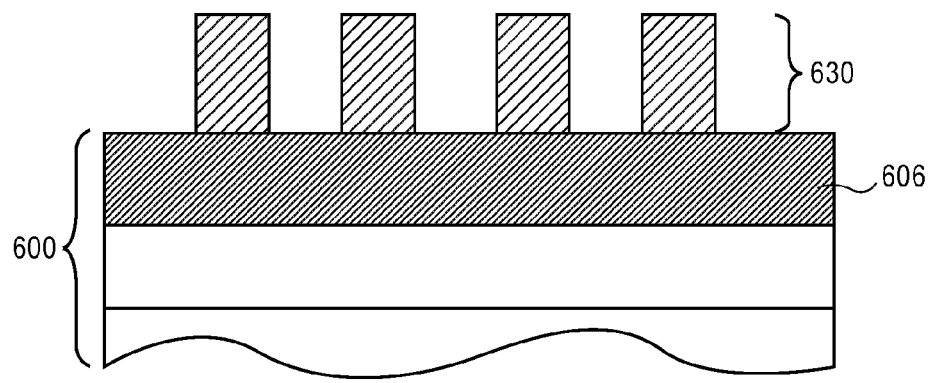

Referring to operation 210 of Flowchart 200 and corresponding FIG. 6E, photo-resist template mask 612 is removed to leave only spacer mask 630 above structure 600. The portion of structure 600 and, in particular, the portion of the top surface of amorphous carbon hard-mask layer 606 that was previously masked by photo-resist template mask 612 is now exposed, as depicted in FIG. 6E.

Photo-resist template mask 612 may be removed by any process suitable to entirely expose the portions of amorphous carbon hard-mask layer 606 previously covered by photo-resist template mask 612 without substantially impacting amorphous carbon hard-mask layer 606. Thus, in accordance with an embodiment of the present invention, photo-resist template mask 612 is removed with a process that is highly selective to amorphous carbon hard-mask layer 606. The amorphous carbon films described in association with second hard-mask layer 306 and, hence, with amorphous carbon hard-mask layer 606, have similar etch characteristics to the etch characteristics of photo-resist template mask 612. Thus, it may be the case that photo-resist template mask 612 cannot be removed with selectivity to amorphous carbon hard-mask layer 606 by an etch process. However, the amorphous carbon films described in association with second hard-mask layer 306 and, hence, with amorphous carbon hard-mask layer 606, typically have a melting temperature well above 1000 degrees Celsius. Therefore, in one embodiment, although the etch characteristics of photo-resist template mask 612 and amorphous carbon hard-mask layer 606 are similar, their thermal behavior is different. In a specific embodiment, photo-resist template mask 612 is removed with total selectivity to amorphous carbon hard-mask layer 606 by a sublimation process described in association with the removal of photo-resist template mask 312 from FIG. 3E. In a particular embodiment, photo-resist template mask 612 is removed by heating to a temperature of approximately 550 degrees Celsius.

Figure 6F:
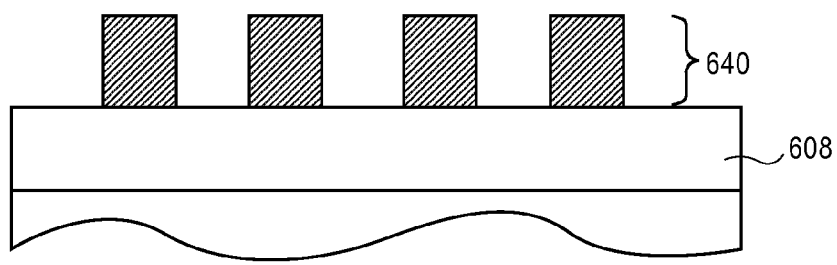
Figure 6G:
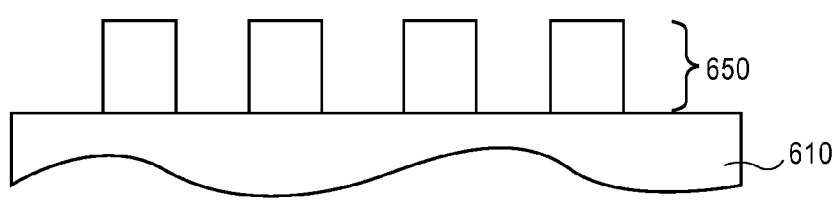

Referring to operation 212 of Flowchart 200 and corresponding FIG. 6F, the image of spacer mask 630 is then transferred to amorphous carbon hard-mask layer 606 to form patterning mask 640 in structure 600. The image of spacer mask 630 may be transferred to amorphous carbon hard-mask layer 606 by any process described in association with the transfer of the image of spacer mask 330 to second hard-mask layer 306 from FIG. 3F. Thus, in accordance with an embodiment of the present invention, the image of spacer mask 630 is transferred directly from spacer mask 630 to amorphous carbon hard-mask layer 606. In a particular embodiment, amorphous carbon hard-mask layer 606 is etched to form patterning mask 640 with a dry etch process using a plasma comprised of gases selected from the group consisting of the combination of $O_2$ and $N_2$ or the combination of $CH_4$, $N_2$ and $O_2$. Spacer mask 630 may be removed, as depicted in FIG. 6F. The image of patterning mask 340 may then be transferred to device layer 608 to provide patterned device layer 650, as depicted in FIG. 6G. In one embodiment, patterned device layer 650 is disposed above substrate 610.

As described in association with FIG. 4, prior to transferring the image of spacer mask 630 to amorphous carbon hard-mask layer 606, it may be desirable to first crop spacer mask 630 to form a cropped spacer mask. Thus, in an accordance with an embodiment of the present invention, a layer of photo-resist is deposited and patterned above spacer mask 630 and over an exposed portion of amorphous carbon hard-mask layer 606. In one embodiment, the photo-resist layer used in the cropping process is removed by a sublimation process in order to not substantially impact the exposed portions of amorphous carbon hard-mask layer 606.

As described in association with FIG. 5, in forming spacer mask 630, it may be desirable to retain area-preservation regions. Thus, in accordance with an embodiment of the present invention, a layer of photo-resist is deposited and patterned above spacer-forming material layer 620 prior to etching and is still present upon exposure of portions of the top surface of amorphous carbon hard-mask layer 606. In one embodiment, the photo-resist layer used in the area-preservation process is removed by a sublimation process in order to not substantially impact the exposed portions of amorphous carbon hard-mask layer 606.

Thus, a method for doubling the frequency of a lithographic process using a photo-resist template mask has been disclosed. In accordance with an embodiment of the present invention, a layered structure having a photo-resist layer formed thereon is first provided. The photo-resist layer is next patterned to form a photo-resist template mask and to expose a portion of the layered structure. In one embodiment, a spacer-forming material layer is then deposited over the photo-resist template mask and above the exposed portion of the layered structure. The spacer-forming material layer is subsequently etched to form a spacer mask and to expose the photo-resist template mask. In a specific embodiment, the photo-resist template mask is finally removed and an image of the spacer mask is transferred to the layered structure.

What is claimed is:

1. A method for patterning a film, comprising:
   forming a photo-resist layer above a device layer;
   patterning said photo-resist layer to form a photo-resist template mask comprised of a series of lines, each line having sidewalls and ends;
   depositing a spacer-forming material layer over said photo-resist template mask;
   etching said spacer-forming material layer to form a spacer mask and to expose said photo-resist template mask, said spacer mask having spacer lines adjacent to the sidewalls of each of the lines of said series of lines of said photo-resist template mask and spacer ends wrapping around the ends of each of the lines of said series of lines of said photo-resist template mask;
   cropping said spacer mask to form a cropped spacer mask by removing the spacer ends, but not removing the spacer lines; and, subsequently,
   removing said photo-resist template mask; and
   transferring an image of said cropped spacer mask to said device layer.

2. The method of claim 1, wherein said spacer-forming material layer is formed by a condensation process, and wherein said photo-resist template mask is removed by a sublimation process.

3. The method of claim 1, wherein an amorphous carbon hard-mask layer is disposed above said device layer and below said photo-resist layer, and wherein said image of said cropped spacer mask is transferred to said amorphous carbon hard-mask layer prior to transferring said image to said device layer.

4. The method of claim 3, wherein a top hard-mask layer is disposed above said amorphous carbon hard-mask layer and below said photo-resist layer, wherein said image of said cropped spacer mask is transferred to said top hard-mask layer prior to transferring said image to said amorphous carbon hard-mask layer, wherein said top hard-mask layer is comprised of a material selected from the group consisting of silicon nitride, amorphous silicon and poly-crystalline silicon, and wherein removing said photo-resist template mask comprises etching using $O_2$.

5. The method of claim 1, wherein said spacer-forming material layer is comprised of silicon oxide or carbon-doped silicon oxide, and wherein etching said spacer-forming material layer to form said spacer mask comprises using a dry etch process with a gas selected from the group consisting of $C_4F_8$, $CH_2F_2$ and $CHF_3$.

6. A method for patterning a film, comprising:
   forming a photo-resist layer above a device layer;
   patterning said photo-resist layer to form a photo-resist template mask comprised of a series of lines, each line having sidewalls and ends;
   depositing a spacer-forming material layer over said photo-resist template mask;
   etching said spacer-forming material layer to form a spacer mask and to expose said photo-resist template mask, said spacer mask having spacer lines adjacent to the sidewalls of each of the lines of said series of lines of said photo-resist template mask and spacer ends wrapping around the ends of each of the lines of said series of lines of said photo-resist template mask;
   cropping said spacer mask to form a cropped spacer mask by removing the spacer ends, but not removing the spacer lines; and, subsequently,
   heating said photo-resist template mask to a temperature sufficient to remove said photo-resist template mask by sublimation without melting said device layer or said spacer mask; and
   transferring an image of said cropped spacer mask to said device layer.

7. The method of claim 6, wherein heating said photo-resist template mask consists of heating to a temperature of approximately 550 degrees Celsius.

8. The method of claim 6, wherein an amorphous carbon hard-mask layer is disposed above said device layer and below said photo-resist layer, and wherein said image of said cropped spacer mask is transferred to said amorphous carbon hard-mask layer prior to transferring said image to said device layer.

9. The method of claim 8, wherein said photo-resist layer is comprised of a material selected from the group consisting of a 248 nm resist, a 193 nm resist, a 157 nm resist, an EUV resist, a phenolic resin matrix with a diazonaphthoquinone sensitizer, poly-cis-isoprene and poly-vinyl-cinnamate.

10. The method of claim 8, wherein a top hard-mask layer is disposed above said amorphous carbon hard-mask layer and below said photo-resist layer, wherein said image of said cropped spacer mask is transferred to said top hard-mask mask layer prior to transferring said image to said amorphous carbon hard-mask layer, and wherein said top hard-mask layer is comprised of a material selected from the group consisting of silicon nitride, amorphous silicon and poly-crystalline silicon.

11. The method of claim 6, wherein said spacer-forming material layer is comprised of silicon oxide or carbon-doped silicon oxide, and wherein etching said spacer-forming material layer to form said spacer mask comprises using a dry etch process with a gas selected from the group consisting of $C_4F_8$, $CH_2F_2$ and $CHF_3$.

12. A method for patterning a film, comprising:

forming a photo-resist layer above a device layer;

patterning said photo-resist layer to form a photo-resist template mask comprised of a series of lines, each line having sidewalls and ends;

condensing a spacer-forming material layer directly on said photo-resist template mask, wherein said photo-resist template mask and said device layer are maintained at a temperature sufficiently low to provide a uniform and conformal layer of said spacer-forming material layer;

etching said spacer-forming material layer to form a spacer mask and to expose said photo-resist template mask, said spacer mask having spacer lines adjacent to the sidewalls of each of the lines of said series of lines of said photo-resist template mask and spacer ends wrapping around the ends of each of the lines of said series of lines of said photo-resist template mask;

cropping said spacer mask to form a cropped spacer mask by removing the spacer ends, but not removing the spacer lines; and, subsequently, removing said photo-resist template mask; and transferring an image of said cropped spacer mask to said device layer.

13. The method of claim 12, wherein said photo-resist template mask and said device layer are maintained at a temperature in a range of 0-100 degrees Celsius throughout the condensing of said spacer-forming material layer.

14. The method of claim 12, wherein said spacer-forming material layer is comprised of carbon-doped silicon oxide having an atomic concentration of carbon atoms in a range of 5-15%.

15. The method of claim 14, wherein etching said spacer-forming material layer to form said spacer mask comprises using a dry etch process with a gas selected from the group consisting of $C_4F_8$, $CH_2F_2$ and $CHF_3$.

16. The method of claim 12, wherein removing said photo-resist template mask comprises heating said photo-resist template mask to a temperature sufficient to remove said photo-resist template mask by sublimation without melting said device layer or said spacer mask.

17. The method of claim 16, wherein heating said photo-resist template mask consists of heating to a temperature of approximately 550 degrees Celsius.

18. The method of claim 12, wherein an amorphous carbon hard-mask layer is disposed above said device layer and below said photo-resist layer, and wherein said image of said cropped spacer mask is transferred to said amorphous carbon hard-mask layer prior to transferring said image to said device layer.

19. The method of claim 18, wherein a top hard-mask layer is disposed above said amorphous carbon hard-mask layer and below said photo-resist layer, wherein said image of said cropped spacer mask is transferred to said top hard-mask layer prior to transferring said image to said amorphous carbon hard-mask layer, and wherein said top hard-mask layer is comprised of a material selected from the group consisting of silicon nitride, amorphous silicon and poly-crystalline silicon.

20. The method of claim 19, wherein removing said photo-resist template mask comprises etching using $O_2$.

* * * * *